(12) United States Patent
Senouci et al.

(10) Patent No.: US 12,431,922 B2
(45) Date of Patent: Sep. 30, 2025

(54) DYNAMIC ANTENNA TUNING APPARATUS AND METHOD

(71) Applicant: SEMICONDUCTOR COMPONENTS INDUSTRIES, LLC, Phoenix, AZ (US)

(72) Inventors: Noureddine Senouci, Le Landeron (CH); Alexander Heubi, La Chaux-de-Fonds (CH)

(73) Assignee: SEMICONDUCTOR COMPONENTS INDUSTRIES, LLC, Scottsdale, AZ (US)

(*) Notice: Subject to any disclaimer, the term of this patent is extended or adjusted under 35 U.S.C. 154(b) by 413 days.

(21) Appl. No.: 17/817,082

(22) Filed: Aug. 3, 2022

(65) Prior Publication Data
US 2023/0060017 A1    Feb. 23, 2023

Related U.S. Application Data

(60) Provisional application No. 63/260,458, filed on Aug. 20, 2021.

(51) Int. Cl.
| | | |
|---|---|---|
| *H04B 1/04* | (2006.01) | |
| *H03F 1/02* | (2006.01) | |
| *H03F 3/24* | (2006.01) | |
| *H04B 5/72* | (2024.01) | |

(52) U.S. Cl.
CPC ......... *H04B 1/0458* (2013.01); *H03F 1/0233* (2013.01); *H03F 3/245* (2013.01); *H04B 5/72* (2024.01); *H03F 2200/105* (2013.01); *H03F 2200/451* (2013.01)

(58) Field of Classification Search
CPC ....... H04B 1/0458; H04B 5/72; H03F 1/0233; H03F 3/245; H03F 2200/105; H03F 2200/451
USPC ...................................................... 455/41.1
See application file for complete search history.

(56) References Cited

U.S. PATENT DOCUMENTS

| | | | |
|---|---|---|---|
| 10,277,267 B1* | 4/2019 | Kerselaers | H04B 17/11 |
| 11,271,662 B2* | 3/2022 | Dubash | H04B 5/266 |
| 11,722,179 B2* | 8/2023 | Peralta | H02J 50/80 |
| | | | 455/41.1 |
| 2012/0075016 A1* | 3/2012 | Visser | H03H 7/40 |
| | | | 330/144 |

(Continued)

FOREIGN PATENT DOCUMENTS

| | | | | |
|---|---|---|---|---|
| CN | 107026663 A | * | 8/2017 | ............... H03F 3/24 |
| EP | 3261262 A1 | | 12/2017 | |

(Continued)

*Primary Examiner* — Mong-Thuy T Tran
(74) *Attorney, Agent, or Firm* — Polansky & Associates, P.L.L.C.; Paul J. Polansky

(57) ABSTRACT

A near-field transmitter includes a power amplifier, a resonant network, an envelope detector, and an antenna tuning circuit. The power amplifier has an input for receiving a communication signal, and an output for providing a differential output signal. The resonant network is coupled to the output of the power amplifier and has a tunable reactive element tuned by a tuning signal. The envelope detector is coupled to the output of the power amplifier for providing an envelope signal in response to the differential output signal. The antenna tuning circuit is for adjusting the tuning signal in response to the envelope signal.

20 Claims, 4 Drawing Sheets

(56) References Cited

U.S. PATENT DOCUMENTS

| | | | | |
|---|---|---|---|---|
| 2013/0281016 A1* | 10/2013 | Mcfarthing | ............. | H04B 5/00 |
| | | | | 455/41.1 |
| 2017/0070199 A1* | 3/2017 | Anderson | ............. | H03F 1/0261 |
| 2019/0207560 A1* | 7/2019 | Sahu | ................... | H03F 3/45179 |
| 2020/0403649 A1* | 12/2020 | Alexanderson | ...... | H04B 1/0458 |
| 2021/0359722 A1* | 11/2021 | Kerselaers | ............... | H04B 5/79 |
| 2022/0303695 A1* | 9/2022 | Sabin | ..................... | G02C 11/06 |
| 2022/0368374 A1* | 11/2022 | Tramoni | ................. | H04B 5/73 |

FOREIGN PATENT DOCUMENTS

| | | | |
|---|---|---|---|
| EP | 3407503 A1 | 11/2018 |
| EP | 3531563 A1 | 8/2019 |

\* cited by examiner

DYNAMIC ANTENNA TUNING APPARATUS AND METHOD

This application claims the benefit of U.S. Provisional Patent Application No. 63/260,458, filed on Aug. 20, 2021, the entire contents of which are incorporated herein by reference.

FIELD OF THE DISCLOSURE

This disclosure relates generally to radio frequency (RF) transmitters, and more specifically to RF transmitters useful for communications systems such as near-field magnetic induction (NFMI) radio systems.

BACKGROUND

Near Field Magnetic Induction (NFMI) technology is well suited to exchange high-bandwidth content, such as audio, wirelessly over short distances with low power and low latency. NFMI is widely used for short range applications like audio streams and communication data exchange to support high-end directional algorithms for hearing aids. NFMI communication provides superior performance in these applications compared to electrical field communication due to better human tissue penetration. In addition, magnetic field signals also decrease more rapidly with distance than electrical field signals, and NFMI better avoids creating interference for surrounding devices. NFMI technology is also used to connect some portable wireless earbuds to support stereo audio streaming.

To improve the communication between two hearing aids, it is important to adjust the antenna circuitry to the precise carrier frequency so that the antenna resonance frequency closely matches the carrier frequency. However, hearing aids may be used for many different head morphologies that create different distances between the ears. The carrier frequency can change during operation due to environmental factors, such as temperature, battery voltage, and the like. Moreover, it would be difficult to determine the exact resonance frequency during operation without stopping the operation of the hearing aids, which can affect user experience.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

Figure 1:
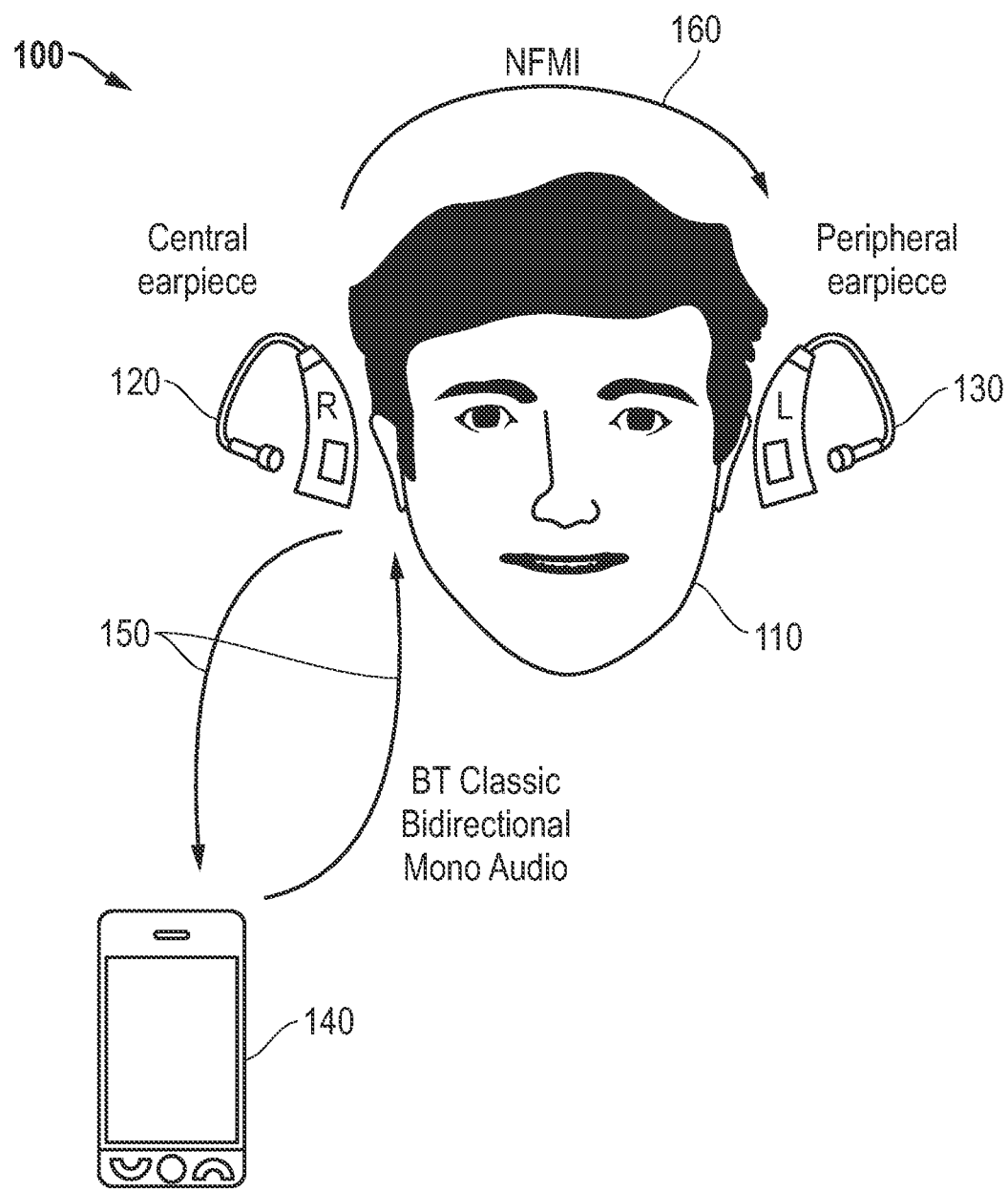
FIG. 1 illustrates a block diagram of an application environment for the radio tuning circuits and methods according to various embodiments of the present disclosure.

FIG. 1 illustrates a block diagram of an application environment 100 for the radio tuning circuits and methods according to various embodiments of the present disclosure. Application environment 100 shows a user 110 having a right audio device 120 and a corresponding left audio device 130. Right audio device 120 and left audio device 130 could be, for example, binaural hearing aids, in-ear stereo audio speakers ("earbuds"), and the like. In this case, one of the audio devices 120 and 130 is paired with a mobile phone 140 or another similar portable or handheld computing device using a link defined by the Bluetooth standard. Mobile phone 140 has an application such as a digital streaming service, an MP3 player, a web browser, a mobile phone receiver, and the like that generates audio content along with control information. Mobile phone 140 communicates with right audio device 120 using a radio link compliant with the Bluetooth standard or a similar standard. Mobile phone 140 communications with only one of the audio devices, e.g., right audio device 120 in the example of FIG. 1, and right audio device 120 in turn communicates with left audio device 130 using an NFMI link 160. For example, right audio device 120 can forward received and decoded audio content to left audio device 130 over NMFI link 160.

NMFI technology is well-suited for these embodiments due to good human tissue penetration, thanks to its relatively low-frequency operation. To improve the communication link budget between audio devices 120 and 130 while covering different head morphologies (i.e., the distance between two ears), there is a need to adjust the antenna circuit's resonant frequency to the targeted carrier frequency. In particular, the resonant frequency can change during operation due to environmental changes. However, stopping the operation of the audio devices to perform a complex recalibration process can also affect the audio quality and user experience.

To solve this problem, the inventors have developed a trimming technique that continuously adjusts the resonant frequency of the antenna filter during operation. The architecture is simple and the transmitter circuit performs the calibration continuously. Moreover, it leverages existing components already used for other purposes in the calibration process.

Figure 2:
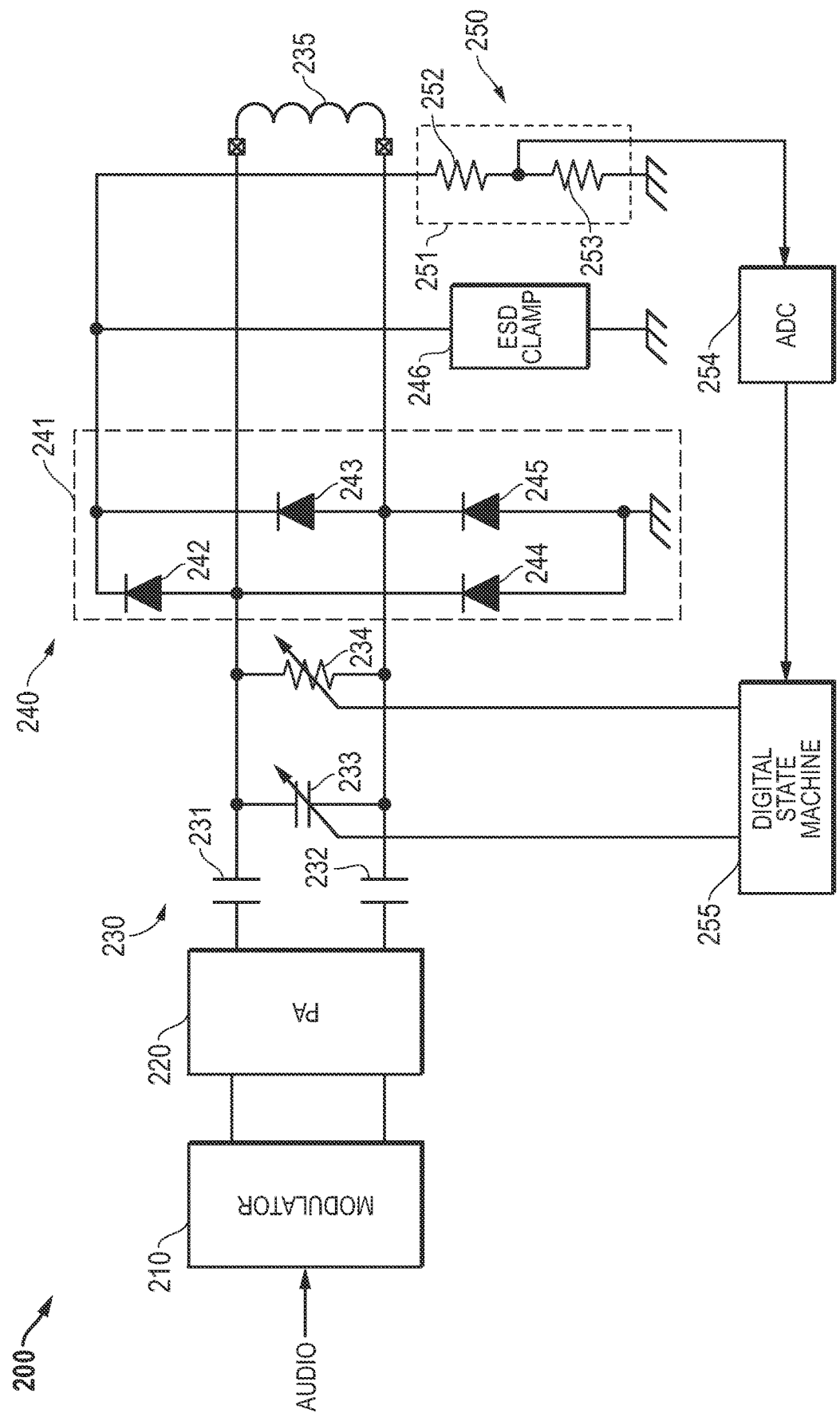
FIG. 2 illustrates in partial block diagram and partial schematic a near-field transmitter according to embodiments of the present disclosure.

FIG. 2 illustrates in partial block diagram and partial schematic a near-field transmitter 200 according to embodiments of the present disclosure. Near-filed transmitter 200 includes generally a modulator 210, a power amplifier labelled "PA" 220, a resonant circuit 230, an envelope detector 240, and an antenna tuning circuit 250.

Modulator 210 has an input for receiving an audio signal, and an output for providing a differential modulated signal. Modulator 210 can perform, for example, a combination of pulse code modulation (PCM) and offset quadrature phase-shift keying (OQPSK) modulation.

Power amplifier 220 has a differential input connected to the differential output of modulator 210, and a differential output. Power amplifier 220 drives a load that provides near-field radiation of sufficient power to be received be another audio device for all human head morphologies and expected operating conditions.

Resonant circuit 230 includes capacitors 231 and 232, a tunable capacitor 233, a tunable resistor 234, and an inductor 235. Capacitor 231 has a first terminal connected to a first output terminal for the differential output of power amplifier 220, and a second terminal. Capacitor 232 has a first terminal connected to a second output terminal for the differential output of power amplifier 220, and a second terminal. Tunable capacitor 233 has a first terminal connected to the second terminal of capacitor 231, a second terminal connected to the second terminal of capacitor 232, and a tuning input terminal. Tunable resistor 234 has a first terminal connected to the second terminal of capacitor 231, a second terminal connected to the second terminal of capacitor 232, and a tuning input terminal. Inductor 235 has a first terminal connected to the second terminal of capacitor 231 through a first integrated circuit terminal, and a second terminal connected to the second terminal of capacitor 232 through a second integrated circuit terminal.

Envelope detector 240 includes a bridge rectifier 241 and an electrostatic discharge (ESD) protection clamp. Bridge rectifier 241 includes PN junction diodes 242-245. PN junction diode 242 has an anode connected to the second terminal of capacitor 231, and a cathode connected to a node which conducts an envelope signal. PN junction diode 243 has an anode connected to the second terminal of capacitor 232, and a cathode connected to the cathode of PN junction diode 243. PN junction diode 244 has an anode connected to ground, and a cathode connected to the second terminal of capacitor 231. PN junction diode 245 has an anode connected to ground, and a cathode connected to the second terminal of capacitor 232. ESD clamp 246 has a first terminal connected to the cathodes of diodes 242 and 243, and a second terminal connected to ground.

Antenna tuning circuit 250 includes a voltage divider 251, an analog-to-digital converter 254 labelled "ADC", and a digital state machine 255. Voltage divider 251 includes resistors 252 and 253. Resistor 252 has a first terminal connected to the cathodes of diodes 242 and 243, and a second terminal. Resistor 253 has a first terminal connected to the second terminal of resistor 252, and a second terminal connected to ground. Analog-to-digital converter 254 has an input connected to the second terminal of resistor 252, and an output. Digital state machine 255 has an input connected to the output of analog-to-digital converter 254, a first output connected to the tuning input of tunable capacitor 233, and a second output connected to the tuning input of tunable resistor 254.

In operation, modulator 210 generates a modulated NFMI signal based on the audio input signal. In one example, the audio input can be a digital audio signal received by a microphone of a hearing aid. In another example, the audio input signal can be an audio stream received from a microphone of mobile phone 140. Modulator 210 first performs PCM encoding, which is a widely used technique for audio signals based on its ability to encode wide-range audio data logarithmically. Then the PCM-encoded data is modulated using offset quadrature phase shift keying (OQPSK) modulation.

Power amplifier 220 amplifies the PCM-encoded, OQPSK modulated audio signal to support a power level suitable for reception by a receiver, such as a receiver in a hearing aid at the other ear of the user under a worst-case head morphology. Near-field transmission uses the magnetic field, rather than the electrical field, to radiate the signal. The magnetic field has the property that its field strength decreases with one over the distance between the transmitter and the receiver to the $6^{th}$ power. Thus, in free space, the NFMI signal attenuates at significantly shorter distances than a corresponding electrical field signal. The magnetic field is also better for transmission near a human body because of its ability to propagate through human tissue.

The amplified signal is AC-coupled through capacitors 231 and 232 to inductor 235, which forms the output inductor/antenna of the system. Tunable capacitor 233 and tunable resistor 234 along with inductor 235 form an RLC resonant network whose resonance can be tuned to the carrier frequency. The tuning technique will be described in more detail below.

Envelope detector 240 detects the envelope of the signal and has a maximum value when the resonant antenna circuit is tuned to the carrier frequency. Rectifier 241 functions as a full-wave rectifier, so that the envelope signal, at the cathodes of PN junction diodes 242 and 243, alternately reflect the positive half-cycles of two out-of-phase sine waves. ESD clamp circuit 246 prevents an electrostatic discharge event from damaging circuitry in NFMI transmitter 200 and provides filtering to envelope detector 240. In the embodiment described herein, PN junction diodes 242-246 are diodes that are already present to provide an ESD discharge path to the complementary metal-oxide-semiconductor (CMOS) integrated circuit protecting it from ESD damage, and thus near-field transmitter 200 leverages existing components to make the tuning circuit small in size.

Voltage divider 251 reduces the voltage of the envelope detector to vary within the input range of ADC 254. ADC 254 outputs a digital signal to digital state machine 255 in response to the reduced voltage. Digital state machine 255 in turn tunes the resonant frequency of resonant network 230 to the carrier frequency based on the output of ADC 254. It does so by changing the value of a reactive element, which in this case is tunable capacitor 233. In other embodiments, the reactive element can be a tunable inductor. It also sets values of tunable resistor 234 to set the damping of the resonant network 230. Since the damping factor does not affect the resonance frequency that is subject to drift, in the disclosed embodiment digital state machine 255 sets the damping factor at startup but does not change it again during operation.

Figure 3:
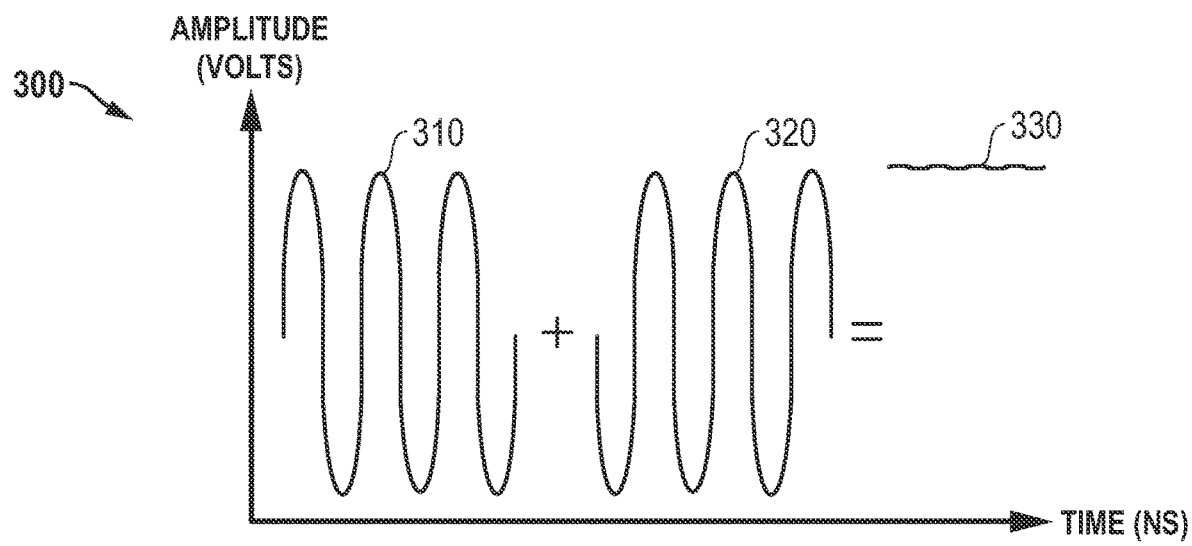
FIG. 3 illustrates a timing diagram of various signals associated with the envelope detector of FIG. 2.

FIG. 3 illustrates a timing diagram 300 of various signals associated with envelope detector 240 of FIG. 2. In FIG. 3, the horizontal axis represents time in nanoseconds (ns), whereas the vertical axis represents amplitude in volts (V). In timing diagram 300, a positive component 310 of the output of power amplifier 220 is shown and is added to a negative component 320 of the output of power amplifier 220. Rectifier 240 blocks the negative half-cycles of each sine wave and the result is a signal 330 with only a very small amount of ripple, thanks to the filtering provided by the ESD clamp, and whose average or "DC" voltage represents the energy transferred through resonant network 230 to output inductor/antenna 235. Digital state machine 255 controls resonant network 230 to continuously increase the DC voltage of signal 330.

Figure 4:
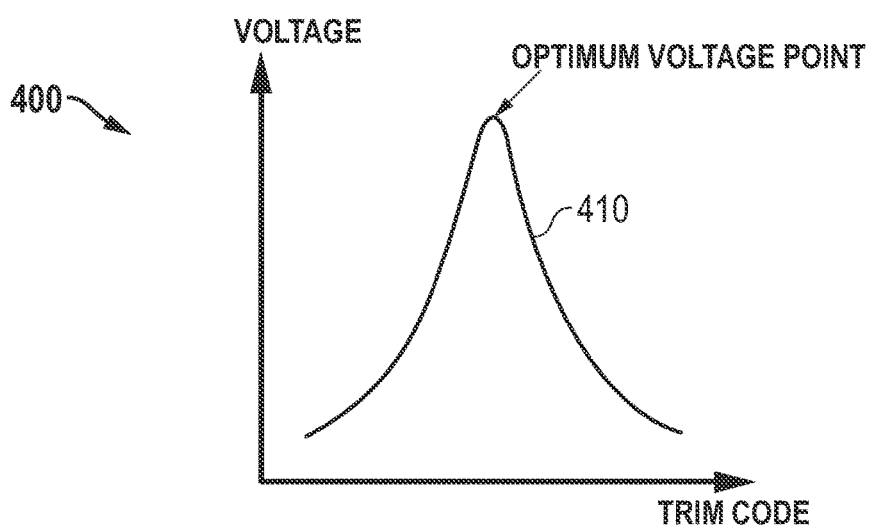
FIG. 4 illustrates a graph of the operation of the antenna tuning circuit of FIG. 2.

FIG. 4 illustrates a graph 400 of the operation of antenna tuning circuit 250 of FIG. 2. In FIG. 4, the horizontal axis represents values of a tuning signal known as the "TRIM CODE", whereas the vertical axis represents amplitude in V. A waveform 410 shows the voltage of the output of envelope detector 240 for various values of the TRIM CODE. As shown in FIG. 4, waveform 410 has a point shown as the "OPTIMUM VOLTAGE POINT" that antenna tuning circuit 250 attempts to find by changing the values of the TRIM CODE. As the TRIM CODE differs from a discrete value that is adjacent to the OPTIMUM VOLTAGE POINT, the voltage of the envelope signal decreases.

Figure 5:
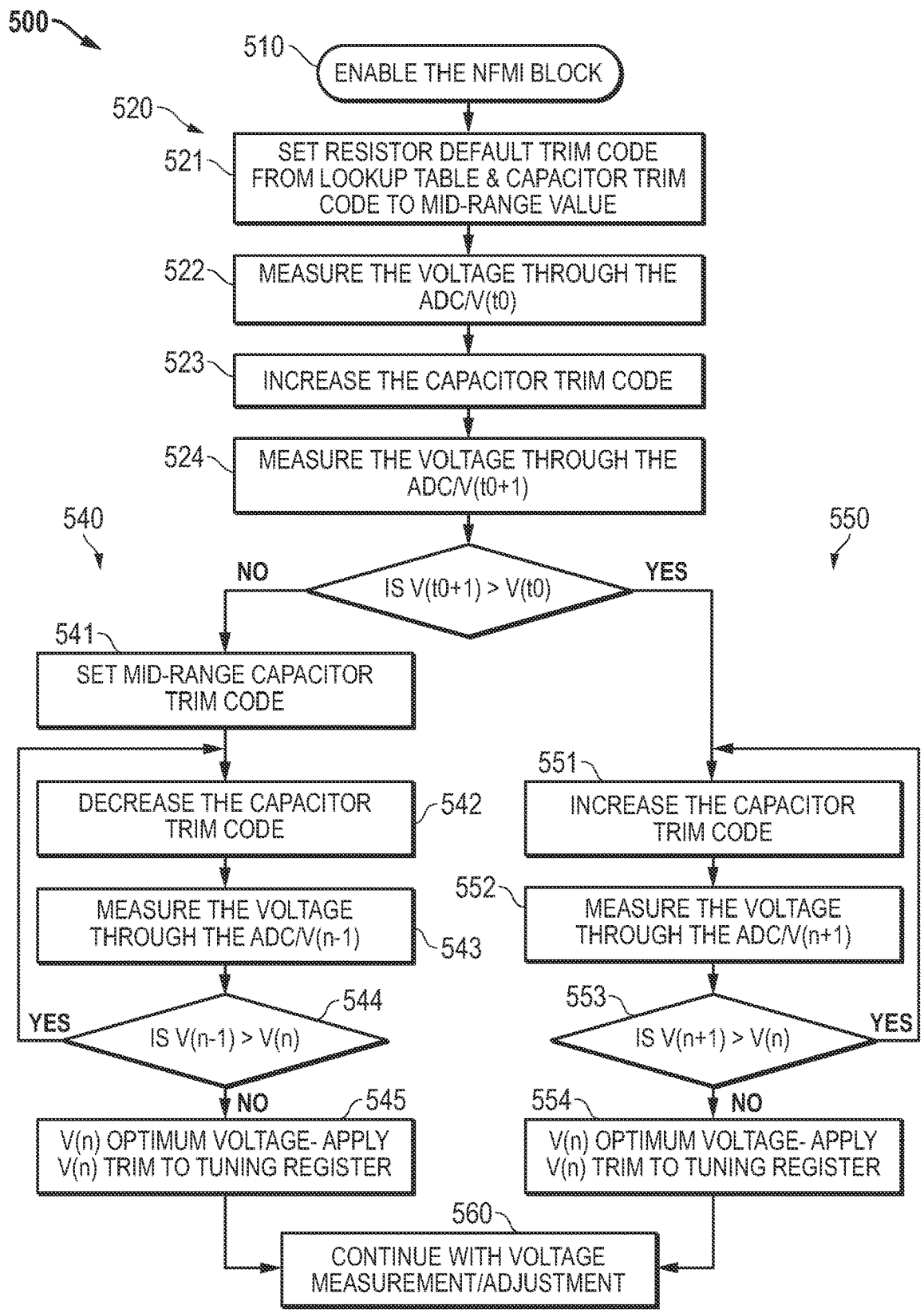
FIG. 5 illustrates a flow chart showing a method of tuning an antenna used by the antenna tuning circuit of FIG. 2 according to various embodiments of the present disclosure.

FIG. 5 illustrates a flow chart showing a method 500 of tuning an antenna used by the antenna tuning circuit 250 of FIG. 2 according to various embodiments of the present disclosure. Method 500 starts when the NFMI circuit block is enabled in an action box 510.

Antenna tuning circuit 250 is initialized in a sub-flow 520. In an action box 521, digital state machine 255 sets the resistance of tunable resistor 234 by setting the TRIM CODE to a default trim code stored in a lookup table. In the exemplary embodiment, the resistance of tunable resistor 234 remains at its default value thereafter during operation because its optimum value will not vary significantly during operation. Digital state machine 255 also sets the initial capacitance of tunable capacitor 233 according to a mid-range value of the TRIM CODE. In an action box 522, digital state machine 255 measures the voltage at the output of ADC 254 as a value $V(t_0)$, in which $t_0$ is the value of the TRIM CODE at the middle of its range. In an action box 523, digital state machine 255 increases the TRIM CODE by one increment, e.g., a binary one. In an action box 524, digital state machine 255 measures the voltage at the output of ADC 254 as a value $V(t0+1)$, in which $t0+1$ is the value of the TRIM CODE plus one increment.

A decision box 530 then evaluates whether $V(t0+1)$ is greater than $V(t0)$. This evaluation determines where the TRIM CODE is along waveform 410 of FIG. 4.

If $V(t0+1)$ is not greater than $V(t0)$, then the TRIM CODE places the voltage of the envelope signal to the right of the OPTIMUM VOLTAGE POINT along waveform 410 of FIG. 4, and flow proceeds to a sub-flow 540. In an action box 541, the TRIM CODE is reset to mid-range value. Then in an action box 542, the TRIM CODE is decreased by a predetermined stop size, such as decreasing the TRIM CODE by 1 binary. In an action box 543, digital state machine 255 measures the value at the output of ADC 254, that is, the value of $V(n-1)$. A decision box 544 then evaluates whether $V(n-1)$ is greater than $V(n)$. If so, then the TRIM CODE still places the voltage of the envelope signal to the right of the OPTIMUM TRIM CODE, and flow returns to action box with 542, in which n is decremented by a predetermined amount, such as binary 1. If not, however, then in an action box 545 the value of $V(n)$ is determined to place the envelope signal at the OPTIMUM VOLTAGE LEVEL, and the value of $V(n)$ is stored in a tuning register in digital state machine 255, and flow proceeds to an action box 560.

If $V(t0+1)$ is greater than $V(t0)$, then the trim code places the voltage of the envelope signal to the left of the optimum voltage point along waveform 410 of FIG. 4, and flow proceeds to a sub-flow 550. In an action box 551, $V(n)$ is set to $V(t0+1)$, the TRIM CODE is increased by the incremental value. Then in an action box 552, digital state machine 255 measures the value at the output of ADC 254, that is, the value of $V(n+1)$. A decision box 553 then evaluates whether $V(n+1)$ is greater than $V(n)$. If so, then the TRIM CODE still places the voltage of the envelope signal to the left of the OPTIMUM VOLTAGE LEVEL, and flow returns to action box with 551, in which the TRIM CODE is incremented by a predetermined amount, such as binary 1. If not, however, then in an action box 545 the value of $V(n)$ is determined to place the envelope signal at the OPTIMUM VOLTAGE LEVEL, and the value of $V(n)$ is stored in a tuning register in digital state machine 255, and flow proceeds to action box 560.

In action box 560, the voltage measurement and adjustment flow continue for another iteration by resuming at action box 522, in which $V(t0)$ is set to be equal to the current value of $V(n)$. This process repeats continuously during operation without affecting communication.

The above-disclosed subject matter is to be considered illustrative, and not restrictive, and the appended claims are intended to cover all such modifications, enhancements, and other embodiments that fall within the scope of the claims. For example, a near-field transmitter and method may be used in a variety of products for which NFMI signals are advantageous, including hearing aids, in-ear audio devices, and the like. The near-field transmitter and method may be used with various modulation schemes, besides the disclosed PCM and OQPSK. In the disclosed embodiment, the programmable reactive element was a tunable capacitor, but in other embodiments, a tunable inductor may be used. The envelope detector can be implemented using dedicated components such as PN junction diodes, or can leverage existing components to detect the envelope of the NFMI signal. Moreover, the method of finding the optimum value of the TRIM CODE may vary from the method disclosed herein.

Thus, to the maximum extent allowed by law, the scope of the present invention is to be determined by the broadest permissible interpretation of the following claims and their equivalents, and shall not be restricted or limited by the forgoing detailed description.

What is claimed is:

1. A near-field transmitter, comprising:
    a power amplifier having an input for receiving a communication signal, and an output for providing a differential output signal;
    a resonant network coupled to said output of said power amplifier and having a tunable reactive element whose reactance value is tuned by a tuning signal;
    an envelope detector coupled to said output of said power amplifier for providing an envelope signal in response to said differential output signal; and
    an antenna tuning circuit for adjusting said tuning signal in response to said envelope signal during operation of the near-field transmitter.

2. The near-field transmitter of claim 1, wherein said resonant network comprises:
    said tunable reactive element comprises a tunable capacitor having a first terminal coupled to a first output of said power amplifier, a second terminal coupled to a second output of said power amplifier, and a tuning input for receiving a first component of said tuning signal; and
    an inductor having a first terminal coupled to said first output of said power amplifier, a second terminal coupled to said second output of said power amplifier.

3. The near-field transmitter of claim 2, wherein said resonant network further comprises:
    a tunable resistor having a first terminal coupled to said first output of said power amplifier, a second terminal coupled to said second output of said power amplifier, and a tuning input for receiving a second component of said tuning signal.

4. The near-field transmitter of claim 2, wherein said antenna tuning circuit comprises:
    a digital state machine having an input coupled to said output of said envelope detector, and an output coupled to said tuning input of said tunable reactive element, wherein said digital state machine adjusts said output continuously to maximize said envelope signal.

5. The near-field transmitter of claim 4, wherein said digital state machine is coupled to said output of said envelope detector through:
   a voltage divider; and
   an analog-to-digital converter coupled to said voltage divider to provide a digital signal representative of a voltage of said envelope signal to said input of said digital state machine.

6. The near-field transmitter of claim 1, wherein said envelope detector comprises:
   a rectifier having inputs coupled to said output of said power amplifier, and an output for providing said envelope signal; and
   a clamp coupled to said output of said rectifier for clamping a voltage on said output of said rectifier.

7. The near-field transmitter of claim 6, wherein said rectifier is formed by a plurality of electrostatic discharge protection diodes.

8. The near-field transmitter of claim 1, wherein said communication signal comprises audio information.

9. The near-field transmitter of claim 1, wherein said communication signal is modulated using pulse-code modulation (PCM).

10. The near-field transmitter of claim 9, wherein said communication signal is further modulated using offset quadrature phase-shift keying (OQPSK) modulation.

11. A near-field transmitter for transmitting a signal using near-field communication, comprising:
   a modulator having an input for receiving a communication signal, and an output for providing a differential output signal to first and second integrated circuit terminals;
   a power amplifier having an input coupled to said output of said modulator, and first and second outputs adapted to be coupled to an inductor, for providing a differential output signal;
   a tunable reactive element coupled between said first and second outputs of said power amplifier whose reactance is tuned by a tuning signal;
   an envelope detector coupled to said output of said power amplifier for providing an envelope signal in response to said differential output signal; and
   an antenna tuning circuit for adjusting said tuning signal in response to said envelope signal.

12. The near-field transmitter of claim 11, wherein said communication signal comprises audio information.

13. The near-field transmitter of claim 11, wherein said communication signal is modulated using pulse-code modulation (PCM).

14. The near-field transmitter of claim 13, wherein said communication signal is further modulated using offset quadrature phase-shift keying (OQPSK) modulation.

15. The near-field transmitter of claim 11, further comprising:
   a tunable resistor having a first terminal coupled to said first output of said power amplifier, a second terminal coupled to said second output of said power amplifier, and a tuning input for receiving a second component of said tuning signal.

16. The near-field transmitter of claim 11, wherein:
   said modulator, said power amplifier, said tunable reactive element, said envelope detector, and said antenna tuning circuit are combined on a monolithic integrated circuit, and said inductor is external to said monolithic integrated circuit.

17. A method of tuning a radio transmitter, comprising:
   forming a communication signal at a carrier frequency;
   amplifying a power of said communication signal and forming a differential output signal in response to said amplifying;
   providing said differential output signal to a resonant network having a tunable reactive element;
   rectifying said differential output signal to provide a rectified signal;
   determining a level of said rectified signal; and
   adjusting a value of a reactance of said tunable reactive element to an optimum amplitude of said rectified signal during operation of the radio transmitter.

18. The method of claim 17, wherein adjusting said value of said tunable reactive element comprises:
   setting said value to an initial amount;
   measuring an initial voltage of said rectified signal;
   increasing said value to a second amount; and
   measuring a subsequent voltage of said rectified signal;
   comparing said subsequent voltage to said initial voltage; and
   determining an optimum value in response to said comparing.

19. The method of claim 18, wherein if said subsequent voltage is less than said initial voltage, adjusting said value of said tunable reactive element further comprises:
   repetitively decreasing said value of said tunable reactive element until a next voltage of said rectified signal is less than a current voltage of said rectified signal; and
   setting said value to an amount corresponding to said current voltage of said rectified signal.

20. The method of claim 18, wherein if said subsequent voltage is greater than said initial voltage, adjusting said value of said tunable reactive element further comprises:
   repetitively increasing said value of said tunable reactive element until a next voltage of said rectified signal is less than a current voltage of said rectified signal; and
   setting said value to an amount corresponding to said current voltage of said rectified signal.

* * * * *